United States Patent [19]

Uetani et al.

[11] Patent Number: 5,424,167

[45] Date of Patent: Jun. 13, 1995

[54] POSITIVE TYPE QUINONEDIAZIDE RESIST COMPOSITION CONTAINING ALKALI-SOLUBLE NOVOLAC RESIN AND AROMATIC HYDROXY COMPOUND ADDITIVE

[75] Inventors: Yasunori Uetani, Toyonaka; Hiroshi Moriuma, Nara, both of Japan

[73] Assignee: Sumitomo Chemical Co., Ltd., Osaka, Japan

[21] Appl. No.: 22,488

[22] Filed: Feb. 25, 1993

[30] Foreign Application Priority Data

Feb. 25, 1992 [JP] Japan ................... 4-037750

[51] Int. Cl.$^6$ ............................................. G03F 7/023
[52] U.S. Cl. ................... 430/191; 430/165; 430/192; 430/193
[58] Field of Search ............... 430/190, 191, 192, 193, 430/165

[56] References Cited

U.S. PATENT DOCUMENTS

| | | | |
|---|---|---|---|
| 3,188,210 | 6/1965 | Fritz et al. | 430/193 |
| 4,387,152 | 6/1983 | Stahlhofen | 430/191 |
| 4,404,272 | 9/1983 | Stahlhofen | 430/191 |

FOREIGN PATENT DOCUMENTS

| | | |
|---|---|---|
| 295465 | 12/1988 | European Pat. Off. . |
| 443607 | 8/1991 | European Pat. Off. . |
| 458988 | 12/1991 | European Pat. Off. . |
| 58-203434 | 11/1983 | Japan . |
| 63-313150 | 12/1988 | Japan . |

OTHER PUBLICATIONS

Kajita et al. Chemical Abstracts, vol. 117, No. 10, 1992, abstract No. 102439b.

Chemical Abstracts, vol. 97, No. 22, 1982, abstract No. 191249y.

*Primary Examiner*—Charles L. Bowers, Jr.
*Assistant Examiner*—Christopher G. Young

*Attorney, Agent, or Firm*—Birch, Stewart, Kolasch & Birch

[57] ABSTRACT

A positive type resist composition comprising an alkali-soluble novolac resin, a quinonediazide compound and a compound represented by general formula (I):

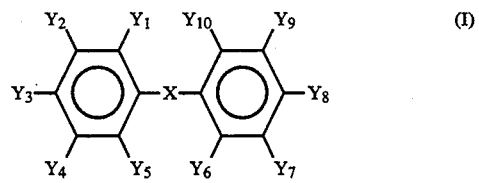

wherein $Y_1$ to $Y_{10}$ each represent a hydrogen atom, a hydroxyl group or an alkyl group, provided that at least one of $Y_1$ to $Y_{10}$ is a hydroxyl group, and X represents one of the groups represented by the following formulas:

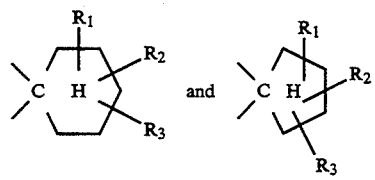

wherein $R_1$ to $R_3$ independently of one another each represent a hydrogen atom or an alkyl group, provided that, as measured by GPC, the pattern area of the component having a molecular weight, converted to polystyrene, 1,000 or below in the alkali-soluble novolac resin is 25% or less based on the total pattern area of the novolac resin from which the pattern area of the unreacted phenol compound is excepted. This positive type resist composition is excellent in the balance between performances such as sensitivity, resolution, heat resistance and adhesive property.

10 Claims, No Drawings

POSITIVE TYPE QUINONEDIAZIDE RESIST COMPOSITION CONTAINING ALKALI-SOLUBLE NOVOLAC RESIN AND AROMATIC HYDROXY COMPOUND ADDITIVE

BACKGROUND OF THE INVENTION

1. Field of the Invention

This invention relates to a positive type resist composition sensitive to radiations such as ultraviolet ray, far ultraviolet ray including excimer laser and the like, electron beam, ion beam, X ray and the like.

2. Related Art

In claim 4 of Japanese Patent Application KOKAI No. 63-313150, there is mentioned a photosensitive mixture comprising an alkali-soluble novolac resin, an ester of 1,2-naphthoquinone-diazidesulfonic acid and a photosensitizer represented by the following general formula:

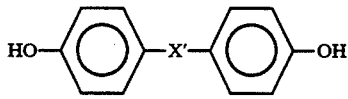

wherein $X'$ represents a single bond, $-CH_2-$, $-SO_2-$, $-S-$, $-CO-$, $-C(CH_3)_2-$, $-CH-CCl_3$ or a group of the following formula:

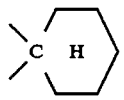

With the appearance of highly integrated circuits, the design rule for integrated circuits has become finer, and today it is requested to form a pattern of sub-micron order. As its result, a positive type resist is required to have superiorities in sensitivity, resolution, heat resistance, etc. to prior ones using a photosensitive mixture such as that mentioned above. For forming a sub-micron pattern, in addition, it is necessary to enhance not only the resolution of resist but also the adhesion between resist and substrate. Particularly in the formation of contact hole, the shape of hole is improved by carrying out a wet etching before the dry etching perforation of substrate, after formation of resist pattern, and thereby isotropically etching the substrate. If the adhesiveness between resist and substrate is not good, the wet etching is accompanied by a great quantity of side etching which causes a short circuit undesirably.

SUMMARY OF THE INVENTION

This invention relates to a positive type resist composition excellent in the balance between performances such as sensitivity, resolution, heat resistance and adhesive property.

This invention provides a positive type resist composition comprising an alkali-soluble novolac resin, a quinonediazide compound and a compound represented by the following general formula (I):

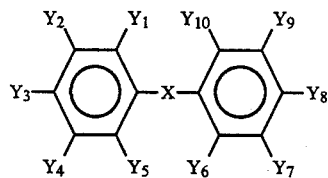

wherein $Y_1$ to $Y_{10}$ independently of one another each represent a hydrogen atom, a hydroxyl group preferably containing 1 to 10 carbon atoms, more preferably containing 1 to 4 carbon atoms, or an alkyl group, provided that at least one of $Y_1$ to $Y_{10}$ is a hydroxyl group, and X represents one of the groups represented by the following formulas:

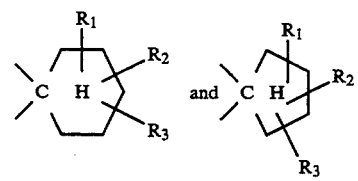

wherein $R_1$ to $R_3$ independently of one another each represent a hydrogen atom or an alkyl group; provided that, as measured by GPC, the pattern area of the component having a molecular weight, converted to polystyrene, of 1,000 or below in the alkali-soluble novolac resin, is 25% or less based on the total pattern area of the novolac resin from which the pattern area of an unreacted phenol compound contained in the novolac resin is excepted.

DETAILED DESCRIPTION OF THE INVENTION

As the alkali-soluble novolac resin, the reaction products formed between phenol compounds and aldehyde compounds can be referred to. Said phenol compounds include phenol, o-, m- and p-cresol, 2,5-xylenol, 3,5-xylenol, 3,4-xylenol, 2,3,5-trimethylphenol, 4-t-butylphenol, 2-t-butylphenol, 3-t-butylphenol, 3-ethylphenol, 2-ethylphenol, 4-ethylphenol, 3-methyl-6-t-butylphenol, 4-methyl-2-t-butylphenol, 2-naphthol, 1,3-dihydroxynaphthalene, 1,5-dihydroxynaphthalene, 1,7-dihydroxynaphthalene, and mixtures of a phenol compound represented by the following general formula (II):

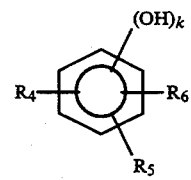

wherein $R_4$ to $R_6$ independently of one another each represent a hydrogen atom or an alkyl or alkoxy group having 1–4 carbon atoms and k represents 1 or 2, and a phenol compound represented by the following general formula (III):

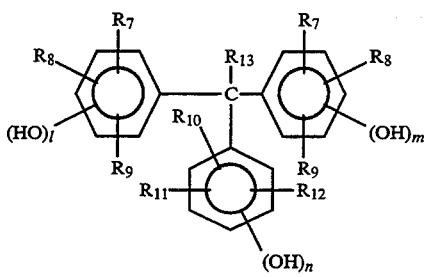

(III)

wherein $R_7$ to $R_{12}$ independently of one another each represent a hydrogen atom or an alkyl or alkoxy group having 1–4 carbon atoms, $R_{13}$ represents a hydrogen atom, an alkyl group having 1–4 carbon atoms or an aryl group, and l, m, and n each represent 0, 1 or 2, provided that $l+m+n>2$, and the like. Preferred examples of the phenol compounds are m-cresol, p-cresol, 2,5-xylenol, 3,5-xylenol, 3,4-xylenol, 2,3,5-trimethylphenol, 3-methyl-6-t-butylphenol, a phenol compound represented by the above general formula (III), and the like. Most preferred examples of the phenol compounds are 2,5-xylenol, m- or p-cresol, a phenol compound represented by the following formula:

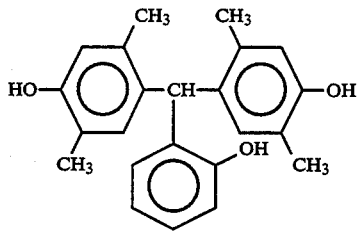

, and the like. These phenol compounds can be used either singly or in the form of a mixture of two or more members.

The aldehyde compounds include formaldehyde, paraformaldehyde, acetaldehyde, propyl aldehyde, benzaldehyde, phenyl aldehyde, α-phenylpropyl aldehyde, β-phenylpropyl aldehyde, o-, m- or p-hydroxybenzaldehyde, glutaraldehyde, glyoxal, o-methylbenzaldehyde, p-methylbenzaldehyde and the like. Preferred examples of the aldehyde compounds are formaldehyde, o-, m- or p-hydroxy benzaldehyde and the like. Most preferred examples of the aldehyde compounds are o-hydroxybenzaldehyde, formaldehyde, and the like.

The reaction between a phenol compound and an aldehyde compound is carried out in the presence of a catalyst in a bulk phase or in a solvent usually at 60°–250° C. preferably 70°–150° C. for 2–3 hours. As the catalyst, organic acids such as formic acid, oxalic acid, p-toluenesulfonic acid, trichloroacetic acid and the like, inorganic acids such as phosphoric acid, hydrochloric acid, sulfuric acid, perchloric acid and the like, and divalent metal salts such as zinc acetate, magnesium acetate and the like can be used. The alkali-soluble novolac resin thus formed after the reaction preferably has a weight average molecular weight (Mw) of 2,000–50,000, as converted to polystyrene.

The resin obtained by the above-mentioned reaction is usually subjected to a treatment of fractionation or the like until the GPC (UV-254 nm) pattern area of the component having a polystyrene-converted molecular weight of 1,000 or below comes to 25% or less based on the total pattern area from which the area of unreacted phenol compound is excepted. From the viewpoint of resolution, adhesiveness, heat resistance and smallness of scum (residue of development), it is preferable that the pattern area of the component having a polystyrene-converted molecular weight of 1,000 or below occupies 20% or less of the total pattern area from which the area of unreacted phenol compound is excepted.

The fractionation is carried out by a method which comprises dissolving the resin obtained by the reaction in a good solvent of which examples include alcoholic solvents such as methanol, ethanol and the like, ketonic solvents such as acetone, methyl ethyl ketone, methyl isobutyl ketone and the like, ether-ester solvents such as ethyl cellosolve acetate and the like, ethylene glycol, its ethers, tetrahydrofuran and the like, followed by pouring the resulting solution into water to precipitate a resin component or by pouring the resulting solution into pentane, hexane, heptane, cyclohexane or the like to separate a resin component from the liquid. The alkali-soluble novolac resin thus obtained preferably has a polystyrene-converted weight average molecular weight (Mw) of 3,000–20,000.

The alkali-soluble novolac resin is added preferably in an amount of 60–90%, preferably 65–85%, by weight based on the total solid component in the resist composition.

Examples of the quinonediazide compound include 1,2-benzoquinonediazide-4-sulfonic ester, 1,2-naphthoquinonediazide-4-sulfonic ester, 1,2-naphthoquinonediazide-5-sulfonic ester and the like. Preferred examples of the quinonediazide compound are 1,2-naphthoquinonediazide-4- and -5-sulfonic esters. These esters can be produced by known processes, namely by a process which comprises subjecting 1,2-naphthoquinonediazide sulfonic acid or benzoquinonediazide sulfonic acid and a compound having a hydroxyl group to a condensation reaction in the presence of a weak alkali, for example.

Examples of said compound having a hydroxyl group include hydroquinone, resorcin, phloroglucin, 2,4-dihydroxybenzophenone; trihydroxybenzophenones such as 2,3,4-trihydroxybenzophenone, 2,2′,3-trihydroxybenzophenone, 2,2′,4-trihydroxybenzophenone, 2,2′,5-trihydroxybenzophenone, 2,3,3′-trihydroxybenzophenone, 2,3,4′-trihydroxybenzophenone, 2,3′,4-trihydroxybenzophenone, 2,3′,5-trihydroxybenzophenone, 2,4,4′-trihydroxybenzophenone, 2,4′-5-trihydroxybenzophenone, 2′,3,4-trihydroxybenzophenone, 3,3′,4-trihydroxybenzophenone 3,4,4′-trihydroxybenzophenone, and the like; tetrahydroxybenzophenones such as 2,3,3′,4-tetrahydroxybenzophenone, 2,3,4,4′-tetrahydroxybenzophenone, 2,2′,4,4′-tetrahydroxybenzophenone, 2,2′,3,4-tetrahydroxybenzophenone, 2,2′,3,4′-tetrahydroxybenzophenone, 2,2′,5,5′-tetrahaydroxybenzophenone, 2,3′,4′,5-tetrahydroxybenzophenone, 2,3′,5,5′-tetrahydroxybenzophenone and the like; pentahydroxybenzophenones such as 2,2′,3,4,4′-pentahydroxybenzophenone, 2,2′,3,4,5′-pentahydroxybenzophenone, 2,2′,3,3′,4-pentahydroxybenzophenone, 2,3,3′,4,5′-pentahydroxybenzophenone and the like; hexahydroxybenzophenones such as 2,3,3′,4,4′,5′-hexahydroxybenzophenone, 2,2′,3,3′,4,5′-hexahydroxybenzophenone and the like; alkyl esters of gallic acid; the oxyflavans mentioned in Japanese Patent Application KOKAI No. 2-84650 as general formula (I); the phenol compounds mentioned in Japanese Patent Application KOKAI No.

2-269351 as general formula (I); the phenol compounds mentioned in Japanese Patent Application KOKAI No. 3-185447 as general formula (I); and the phenol compounds represented by the following general formula (IV):

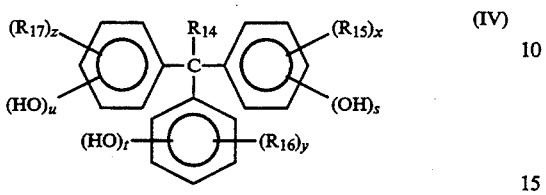

wherein $R_{14}$ to $R_{17}$ each represent a hydrogen atom or an alkyl, alkenyl, alkoxy or aryl group; x, y and z each represent 0, 1, 2, 3 or 4; and s, t and u each represent 0, 1, 2, 3 or 4, provided that s+t+u is 2 or greater.

Among these compounds having hydroxyl groups, preferable are the oxyflavans mentioned in Japanese Patent Application KOKAI No. 2-84650 (corresponding to U.S. Pat. No. 5,059,507) and the phenol compounds mentioned in Japanese Patent Application KOKAI No. 3-185447 (corresponding to SO 92/2205 and EP-0 525 185) represented by the general formulas (I) and (IV).

The quinonediazide compounds are added usually in an amount of 5–50% by weight and preferably in an amount of 10–40% by weight based on the total solid component of the positive type resist composition.

As the compound represented by general formula (I),

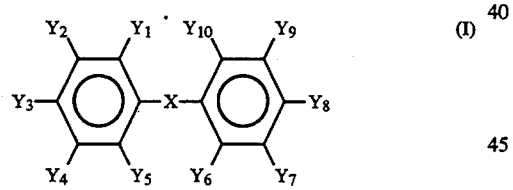

the following can be referred to, for example:

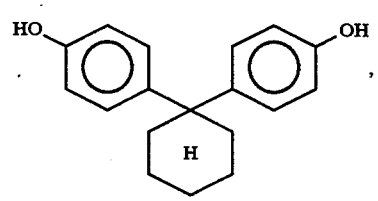

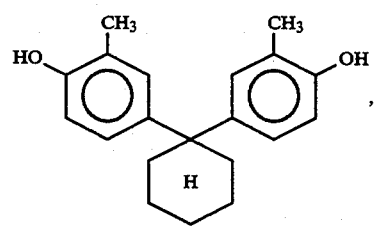

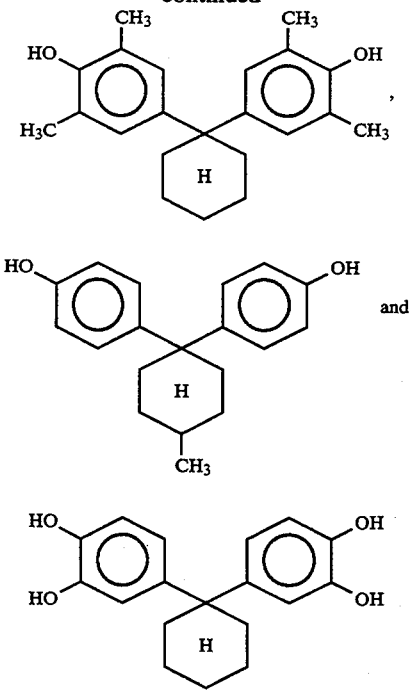

and the like.

The compound represented by general formula (I) can easily be produced by reacting the corresponding phenol compound and a cyclopentanone or cyclohexanone compound in the presence of an acid catalyst. The compound represented by general formula (I) is used either singly or in the form of a mixture of two or more members, and it is added preferably in an amount of 5–20%, preferably 5–15%, by weight based on the total solid component in the positive type resist composition.

If desired, other additive resins such as polyvinylphenol or styrene-maleic acid copolymers, etc., surfactants, stabilizers, dyes for additionally making visible the formed image, photosensitizers and various additives conventionally used in this field of technology may be incorporated into the positive type resist composition.

The positive type resist composition of this invention is applied on a wafer in a liquid form and dried to form a film of the resist composition on the wafer by means of a method conventionally used in this field of technology.

As the solvent used for preparation of resist solution, those having an appropriate drying speed and capable of leaving behind a uniform and smooth coating film when evaporated are preferable. As such solvents, glycol ether esters such as ethyl cellosolve acetate, propylene glycol monomethyl ether acetate and the like, the solvents mentioned in Japanese Patent Application KOKAI No. 2-220056, esters such as ethyl pyruvate, n-amyl acetate, ethyl lactate and the like, and ketones such as 2-heptanone, y-butyrolactone and the like can be referred to. These solvents are used either singly or in the form of a mixture thereof. Though the amount of the solvent is not critical so far as a coating film uniform in quality and free from pin-hole and unevenness can be formed on a wafer, its amount is usually so controlled that the concentration of solid component, namely the sum of quinonediazide compound, alkali-soluble novolac resin and the compound of general formula (I), in the resist solution comes to 3-50% by weight.

The positive type resist composition of this invention is excellent in the balance between performances such as sensitivity, resolution, heat resistance and adhesiveness.

Next, this invention will be illustrated more concretely by way of the following examples, wherein parts are by weight.

EXAMPLES 1 TO 4 AND COMPARATIVE EXAMPLES 1 TO 4

A resist solution was prepared by mixing a quinonediazide compound as a photosensitizer, an alkali-soluble novolac resin and a compound represented by one of the following formulas:

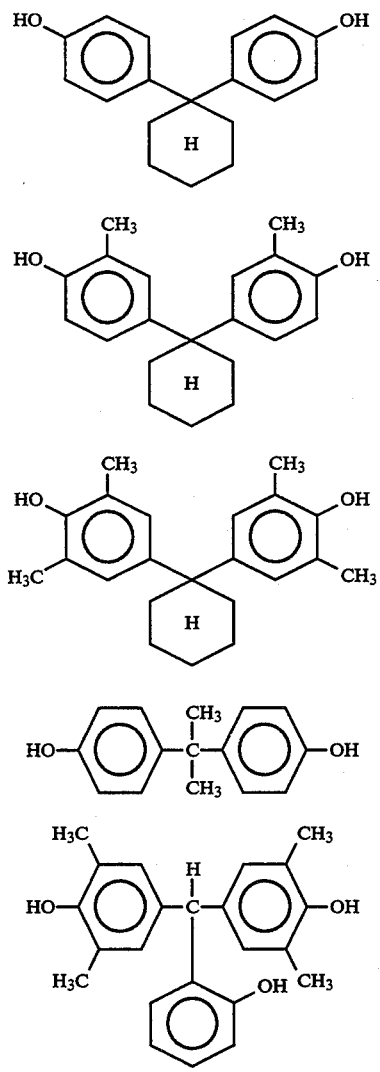

with 48 parts of 2-heptanone as a solvent at a compounding ratio shown in Table 1 and filtering the resulting mixture through a Teflon filter having a pore size of 0.2 μm.

(1) Adhesive property was evaluated in the following manner.

After treating a silicon wafer having a thermally oxidized film of 10,000Å thickness with hexamethyldisilazane, the treated wafer was coated with a resist solution by the use of a rotary coater and baked for 60 seconds on a hot plate kept at 90° C. Thickness of the resist film was 1.1 μm.

Subsequently, the coated wafer was exposed to light by means of a reduced projection type exposing machine (Model NSR1755i7A, manufactured by Nikon, NA=0.50) emitting an exposing light having a wavelength of 365 nm (i ray). After prebaking the exposed wafer for 60 seconds on a hot plate kept at 110° C., the wafer was developed for one minute with SOPD (developing solution manufactured by Sumitomo Chemical Co., Ltd.) to obtain a line-and-space pattern. Then, the wafer was post-baked for 30 minutes in a clean oven kept at 120° C. The post-baked wafer was dipped in a nonionic surfactant solution containing 0.05% of heptylphenoxy poly(ethyleneoxy)-ethanol for 15 seconds, wet-etched with buffered hydrofluoric acid (manufactured by Morita Kagaku K. K.) and then rinsed with deionized water. Then, the cross section of the wafer was visually examined by means of a scanning electron microscope to measure the quantity of etching in the depth direction (a) and the quantity of side etching (b). By referring to ratio b/a, the adhesive property was evaluated. The resist pattern used for measurement of the quantity of side etching was a large pattern having a width exceeding 100 μm.

(2) Resolution was evaluated in the following manner.

A line-and-space pattern was prepared in the same manner as in (1), except that the oxide film wafer was replaced with an non-oxidized silicon wafer. Then, the cross section was visually examined by means of a scanning electron microscope. A minimum line width which can be separated at a light exposure (effective sensitivity) enough to resolve a 0.8 μm line-and-space pattern into 1:1 was taken as a degree of resolution.

(3) Sensitivity of resist was expressed by the effective sensitivity mentioned above.

(4) Heat resistance of resist was evaluated in the following manner.

After formation of a resist pattern, the wafer was heated on a direct hot plate for 3 minutes at a predetermined temperature, and then the occurrence of thermal deformation in 3 μm line-and-space pattern was visually examined by means of a scanning electron microscope.

The results are summarized in the following table.

TABLE

| | Composition of resist | | | Performances of resist | | | |
|---|---|---|---|---|---|---|---|
| Example No. | Resin (parts) | Photosensitive material (parts) | Compound (parts) | Resolution (μm) | Adhesiveness | Effective sensitvitiy (msec) | Heat resistance (°C.) |
| Example | | | | | | | |
| 1 | B, 15 | C, 4 | a, 2 | 0.45 | 1.4 | 400 | 145 |
| 2 | B, 15 | C, 4 | a, 3 | 0.4 | 1.3 | 350 | 140 |
| 3 | B, 15 | C, 4 | b, 3 | 0.45 | 1.4 | 400 | 140 |

TABLE-continued

| Example No. | Composition of resist | | | Performances of resist | | | |
|---|---|---|---|---|---|---|---|
| | Resin (parts) | Photosensitive material (parts) | Compound (parts) | Resolution (μm) | Adhesiveness | Effective sensitivity (msec) | Heat resistance (°C.) |
| 4 | B, 15 | C, 4 | c, 3 | 0.45 | 1.4 | 450 | 140 |
| Comp. Example | | | | | | | |
| 1 | B, 15 | C, 4 | d, 3 | 0.5 | 2.0 | 300 | 125 |
| 2 | B, 15 | C, 4 | e, 3 | 0.4 | 2.0 | 400 | 140 |
| 3 | A, 15 | C, 4 | — | 0.6 | 2.0 | 400 | 125 |
| 4 | A, 15 | C, 4 | a, 3 | 0.6 | 1.4 | 250 | 120 |

Resin A: a novolac resin having a polystyrene-converted weight average molecular weight of 7,500 prepared by carrying out a reaction under reflux in the presence of an oxalic acid catalyst at molar ratios of m-cresol/p-cresol=4/6 and cresol/formaldehyde=1/0.8, in which the GPC pattern area of the component having a molecular weight of 1,000 or below occupies 27% of the total pattern area except for the area of unreacted phenol compound.

Resin B: a novolac resin having a polystyrene-converted weight average molecular weight of 7,500, in which the GPC pattern area of the component having a molecular weight of 1,000 or below occupies 15.5% of the total pattern area except for the area of unreacted phenol compound, prepared by carrying out a reaction under reflux in the presence of an oxalic acid catalyst at molar ratios of m-cresol/p-cresol=5/5 and cresol/formaldehyde=1/0.8 to obtain a novolac resin having a polystyrene-converted weight average molecular weight of 4,000, followed by fractionation.

Photosensitive material (quinonediazide compound) C: a reaction product formed between naphthoquinone-(1,2)-diazide-(2)-5-sulfonic acid chloride and a compound represented by the following formula:

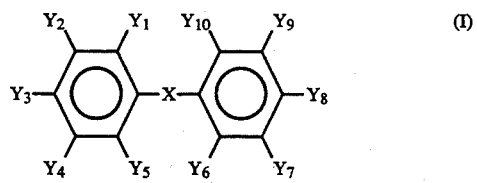

at a molar ratio of 2.6.

What is claimed is:

1. A positive type resist composition comprising an alkali-soluble novolac resin obtained by reaction between a phenol compound with an aldehyde compound, a quinonediazide compound and a compound represented by general formula (I):

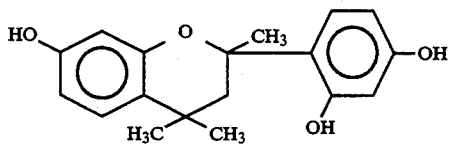

wherein $Y_1$ to $Y_{10}$ each represent a hydrogen atom, a hydroxyl group or an alkyl group, provided that at least one of $Y_1$ to $Y_{10}$ is a hydroxyl group, and X represents one of the groups represented by the following formulas:

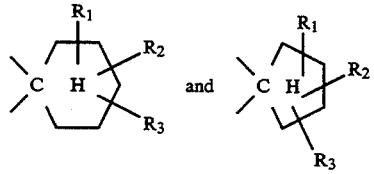

wherein $R_1$ to $R_3$ independently of one another each represent a hydrogen atom or an alkyl group wherein the alkali-soluble novolac resin is added in an amount of 60–90% by weight based on the total solid component in the resist composition, the quinonediazide compound is added in an amount of 5–50% by weight based on the total solid component in the resist composition, and the compound represented by the general formula (I) is added in an amount of 5–20% by weight based on the total solid component in the resist composition, provided that said alkali-soluble novolac resin has an area of a GPC pattern having a range wherein the molecular weight less than 1000, as converted to polystyrene, does not exceed 18% of the whole pattern area, excluding any unreacted phenol compound.

2. A positive type resist composition according to claim 1, wherein the alkali-soluble novolac resin has a range from 3,000 to 20,000 in a weight average molecular weight.

3. A positive type resist composition according to claim 1, wherein the quinonediazide compound is 1,2-benzoquinonediazide-4-sulfonic ester, 1,2-naphthoquinonediazide-4-sulfonic ester or 1,2-naphthoquinonediazide-5-sulfonic ester.

4. A positive type resist composition according to claim 1, wherein the phenol compound is phenol, o-, m- or p-cresol, 2,5-xylenol, 3,5-xylenol, 3,4-xylenol, 2,3,5-trimethylphenol, 4-t-butylphenol, 2-t-butylphenol, 3-t-butylphenol, 3-ethylphenol, 2-ethylphenol, 4-ethylphenol, 3-methyl-6-t-butylphenol, 4-methyl-2-t-butylphenol, 2-naphthol, 1,3-dihydroxynaphthalene, 1,5-dihydroxynaphthalene or 1,7-dihydroxynaphthalene.

5. A positive type resist composition according to claim 1, wherein the phenol compound is 2,5-xylenol, m-cresol, p-cresol or phenol compound represented by formula:

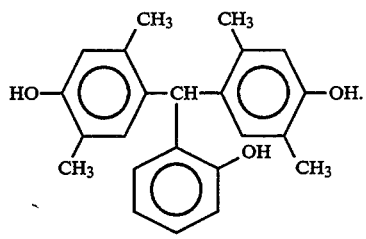

6. A positive type resist composition according to claim 1, wherein the aldehyde compound is formaldehyde, paraformaldehyde, acetaldehyde, propyl aldehyde, benzaldehyde, phenyl aldehyde, α-phenylpropyl aldehyde, β-phenylpropyl aldehyde, o-, m- or p-hydroxybenzaldehyde, glutaraldehyde, glyoxal, o-methylbenzaldehyde or p-methylbenzaldehyde.

7. A positive type resist composition according to claim 1, wherein the aldehyde compound is o-hydroxybenzaldehyde or formaldehyde.

8. A positive type resist composition according to claim 1, wherein the compound represented by the general formula (I)

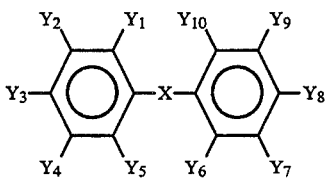

(I)

wherein $Y_1$ to $Y_{10}$ and X are as defined above, is

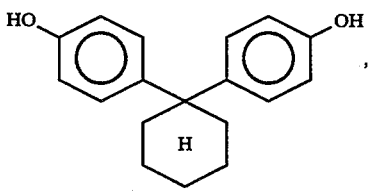

,

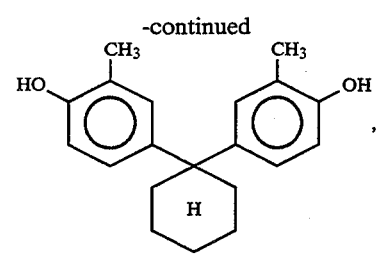

,

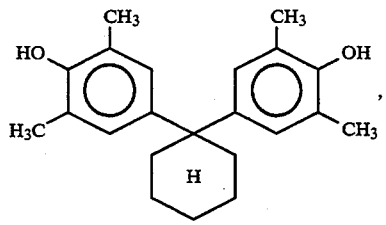

,

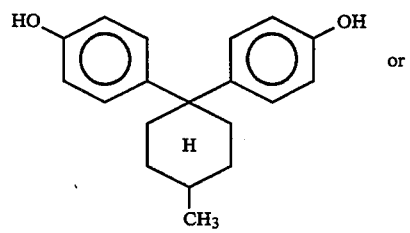

or

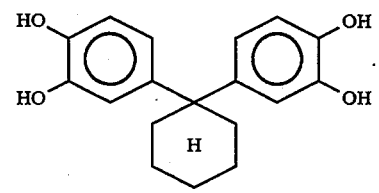

9. A positive type resist composition according to claim 1, wherein the quinonediazide compound is a reaction product formed between naphthoquinone-(1,2)-diazide-(2)-5-sulfonic acid chloride and a compound represented by the following formula:

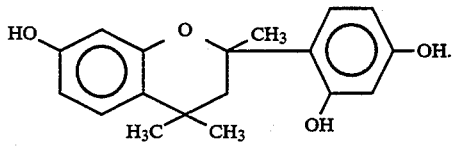

10. A positive type resist composition according to claim 1, wherein the resist composition contains other additive resins, surfactants, stabilizers, dyes for additionally making visible the formed image and photosensitizers.

* * * * *